(12) United States Patent
Ma et al.

(10) Patent No.: US 11,728,962 B2
(45) Date of Patent: Aug. 15, 2023

(54) MULTI-PHASE CLOCK SIGNAL GENERATION CIRCUITRY

(71) Applicant: XILINX, INC., San Jose, CA (US)

(72) Inventors: Shaojun Ma, San Jose, CA (US); Chi Fung Poon, Sunnyvale, CA (US); Kevin Zheng, San Jose, CA (US); Parag Upadhyaya, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/644,066

(22) Filed: Dec. 13, 2021

(65) Prior Publication Data

US 2023/0188314 A1 Jun. 15, 2023

(51) Int. Cl.
*H04L 7/00* (2006.01)
*H03K 19/21* (2006.01)

(52) U.S. Cl.
CPC ........... *H04L 7/0037* (2013.01); *H03K 19/21* (2013.01)

(58) Field of Classification Search
CPC ......... H04L 7/0037; H03K 19/21; H03L 7/00; G06F 1/06
USPC .......................................................... 375/354
See application file for complete search history.

(56) References Cited

U.S. PATENT DOCUMENTS

| 10,536,151 | B1* | 1/2020 | Zhou .................... G06F 1/06 |
| 2013/0053384 | A1 | 3/2013 | Otis et al. |
| 2013/0121094 | A1* | 5/2013 | Zerbe ................ G11C 7/1057 |
| | | | 365/194 |
| 2021/0152180 | A1 | 5/2021 | Shin et al. |

OTHER PUBLICATIONS

Raj, M. et al., "A 4-to-11 GHz injection-locked quarter-rate clocking for an adaptive 153fJ/b optical receiver in 28nm Fdsoi Cmos," 2015 IEEE International Solid-State Circuits Conference—(ISSCC) Digest of Technical Papers, 2015, pp. 1-3.
Chen, S. et al., "A 4-to-16GHz inverter-based injection-locked quadrature clock generator with phase interpolators for multi-standard I/Os in 7nm FinFET," 2018 IEEE International Solid-State Circuits Conference—(ISSCC), 2018, pp. 390-392.

(Continued)

*Primary Examiner* — Leila Malek
(74) *Attorney, Agent, or Firm* — Patterson + Sheridan, LLP

(57) ABSTRACT

Clock generation circuitry includes quadrature locked loop circuitry having first injection locked oscillator circuitry, second injection locked oscillator circuitry, and XOR circuitry. The first injection locked oscillator circuitry receives a first input signal and a second input signal and outputs first clock signals. The first input signal and the second input signal correspond to a reference clock signal. The second injection locked oscillator circuitry is coupled to outputs of the first injection locked oscillator circuitry, and receives the first clock signals and generates second clock signals. The XOR circuitry receives the second clock signals and generates a first clock signal, a second clock signal, a third clock signal, and a fourth clock signal. The frequencies of the first clock signal, the second clock signal, the third clock signal, and the fourth clock signal are greater than the frequency of the reference clock signal.

17 Claims, 6 Drawing Sheets

(56) References Cited

OTHER PUBLICATIONS

Wang, Z. et al. "11.4 A High-Accuracy Multi-Phase Injection-Locked 8-Phase 7GHz Clock Generator in 65nm with 7b Phase Interpolators for High-Speed Data Links," 2021 IEEE International Solid-State Circuits Conference (ISSCC), 2021, pp. 186-188.
Raj, Mayank, "A Wideband Injection Locked Quadrature Clock Generation and Distribution Technique for an Energy-Proportional 16-32 GB/s Optical Receiver in 28nm FDSOI CMOS", IEEE Journal of Solid-State Circuits, vol. 51, No. 10, Oct. 2016 (17 pages).

* cited by examiner

MULTI-PHASE CLOCK SIGNAL GENERATION CIRCUITRY

TECHNICAL FIELD

Examples of the present disclosure generally relate to generating clock signals, and, more particularly, to clock generation circuitry for generating multi-phase clock signals.

BACKGROUND

Communication systems include serializer/deserializer (SerDes) devices. SerDes devices utilize polyphase interpolation to adjust the phase of the received signals and reduce errors. In one instance, polyphase interpolation uses multi-phase clock signals for phase adjustment. Further, communication systems use frequency doubler devices to reduce power when communicating clock signals between transceiver devices. In such instances, the frequency of the clock signal is reduced before being transmitted between the transceiver devices and increased within the receiving transceiver device. Transmitting a clock signal at a reduced frequency reduces the amount of power used by a communication system. However, in communication devices that utilize multi-phase clock signals, the conventional techniques used to generate the multi-phase clock signals are error prone. Further, in communication devices that utilize a reduced frequency clock signal, the available operating speeds of the communication devices are limited. Accordingly, there is a need for improved clock generation circuitry for generating multi-phase clock signals with an increased frequency to support high speed communication devices (e.g., more than about 200 Gbps) having high frequency clock signals (e.g., greater than about 20 GHz).

SUMMARY

Communication systems utilize multi-phase clock signals to reduce errors within received signals and low frequency clock signals to reduce power. A referenced clock signal is received by clock generation circuitry, and the clock generation circuitry generates multi-phase clock signals having an increased frequency. The clock generation circuitry includes quadrature locked loop circuitry cascaded with injection locked circuitry and XOR circuitry to generate multi-phase clock signals having an increased frequency from a received reference clock signal.

In one example, clock generation circuitry includes quadrature locked loop circuitry having first injection locked oscillator circuitry, second injection locked oscillator circuitry, and XOR circuitry. The first injection locked oscillator circuitry receives a first input signal and a second input signal and outputs first clock signals. The first input signal and the second input signal correspond to a reference clock signal. The second injection locked oscillator circuitry is coupled to outputs of the first injection locked oscillator circuitry, and receives the first clock signals and generates second clock signals. The XOR circuitry receives the second clock signals and generates a first clock signal, a second clock signal, a third clock signal, and a fourth clock signal. The frequencies of the first clock signal, the second clock signal, the third clock signal, and the fourth clock signal are greater than the frequency of the reference clock signal.

In one example, a communication system comprises transceiver circuitry that receives a reference clock signal. The transceiver circuitry includes quadrature locked loop circuitry having first injection locked oscillator circuitry, second injection locked oscillator circuitry, and XOR circuitry. The quadrature locked loop generates differential input signals from the reference clock signal. The first injection locked oscillator circuitry receives the differential input signals and outputs first clock signals. The second injection locked oscillator circuitry is coupled to outputs of the first injection locked oscillator circuitry, receives the first clock signals, and generates second clock signals. The XOR circuitry receives the second clock signals and generates a first clock signal, a second clock signal, a third clock signal, and a fourth clock signal. The frequencies of the first clock signal, the second clock signal, the third clock signal, and the fourth clock signal are greater than the frequency of the reference clock signal.

In one example, a method includes receiving a reference clock signal, and generating first and second differential signals from the reference clock signal. The method further includes generating, via first injection locked oscillator circuitry of quadrature locked loop circuitry, first clock signals from the first and second differential signal. Further, the method includes generating, via second injection locked oscillator circuitry, second clock signals from the first clock signal. The method further includes generating, via XOR circuitry, a first clock signal, a second clock signal, a third clock signal, and a fourth clock signal from the second clock signal. The frequencies of the first clock signal, the second clock signal, the third clock signal, and the fourth clock signal are greater than the frequency of the reference clock signal.

BRIEF DESCRIPTION OF THE DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
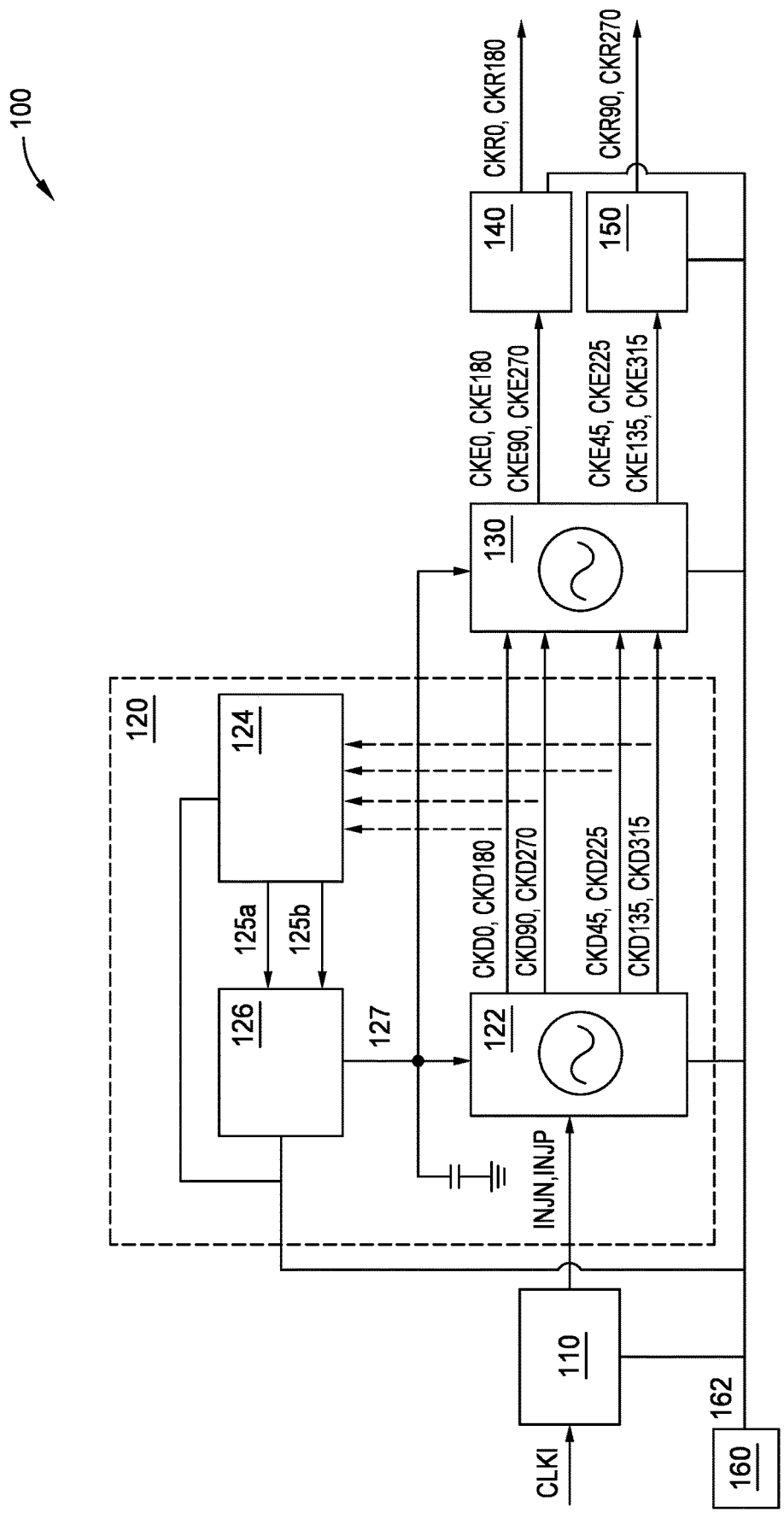
FIG. 1 is a schematic diagram of clock generation circuitry, according to an example.

A communication system includes clock generation circuitry that generates multi-phase clock signals having an increased frequency from that of a single phase reference clock signal. The reference clock signal is communicated between transceiver devices of a communication system. A first transceiver device includes transmitter circuitry that communicates the reference clock signal to receiver circuitry of a second transceiver device. Reducing the frequency of the reference clock signal before transmitting the reference clock signal reduces the power used by the corresponding communication system.

The clock generation circuitry generates multi-phase clock signals having a frequency greater than that of the reference clock signal. The frequency of the multi-phase clock signals is at least about 20 GHz. Accordingly, the clock generation circuitry is able to support high speed communication systems (e.g., greater than about 200 Gbps). Further, the clock generation circuitry generates high accuracy multi-phase clock signals. High accuracy multi-phase clock signals have less than about one degree of phase error and reduce data processing errors within the corresponding transceiver device.

In one example, the clock generation circuitry includes quadrature locked loop (QLL) circuitry cascaded with injection locked oscillator (ILO) circuitry, and XOR circuitry. The QLL circuitry generates first multi-phase clock signals from the single phase reference clock signal. The first multi-phase clocks signals are output to the ILO circuitry. The ILO circuitry reduces phase errors within the multi-phase clock signals, generating second multi-phase clock signals. The XOR circuitry receives the second multi-phase clock signals and generates output clock signals having an increased frequency. The XOR circuitry increases the frequency of the output clock signals from that of the reference clock signal by M times, where M is two. In other examples, M may be greater than two.

A communication system including clock generation circuitry as described above to generate a high frequency (e.g., at least about 20 GHz) multi-phase clock signals having reduced phase errors supports operating at increased speeds (e.g., greater than about 200 Gbps), while outputting data signals with reduced errors, as compared to conventional communication systems. Further, such communication systems provide higher performance with increased power savings as compared to conventional communication systems.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1 illustrates a clock generation circuitry 100, according to one or more examples. The clock generation circuitry 100 receives a clock signal CLKI (e.g., a reference clock signal), and generates multi-phase clock signals CKR0, CKR90, CKR180, and CKR270. The clock signal CLKI is a single phase clock signal. In one example, the clock signal CLKI has a frequency of equal to or less than about 10 GHz. The clock generation circuitry 100 generates multi-phase clock signals CKR0, CKR90, CKR180, and CKR270 from the single phase clock signal CLKI. Further, the frequency of the multi-phase clock signals CKR0, CKR90, CKR180, and CKR270 is increased with reference to the clock signal CLKI. For example, the frequencies of the multi-phase clock signals CKR0, CKR90, CKR180, and CKR270 are at least twice the frequency of the clock signal CLKI. In such an embodiment, the clock generation circuitry 100 may be referred to as frequency doubler circuitry. In other examples, the frequencies of the multi-phase clock signals CKR0, CKR90, CKR180, and CKR270 are N times the frequency of the clock signal CLKI. N is 2. In other examples, N is greater than 2.

In one example, the frequency of the multi-phase clock signals CKR0, CKR90, CKR180, and CKR270 is at least about 14 GHz. In yet other examples, the frequency of the multi-phase clock signals CKR0, CKR90, CKR180, and CKR270 is at least about 20 GHz, at least about 22 GHz, or at least about 28 GHz.

Each of the multi-phase clock signals CKR0, CKR90, CKR180, and CKR270 has a different phase. For example, the phase of the clock signal CKR90 differs from the phase of the clock signal CKR0 by 90 degrees. The phase of the clock signal CKR180 differs from the phase of the clock signal CRK90 by 90 degrees, and from the phase of the clock signal CKR0 by 180 degrees. The phase of the clock signal CKR270 differs from the phase of the clock signal CKR180 by 90 degrees, from the phase of the clock signal CKR90 by 180 degrees, and from the phase of the clock signal CKR0 by 270 degrees.

The clock generation circuitry 100 includes single ended to differential (S2D) circuitry 110, quadrature locked loop (QLL) circuitry 120, injection locked oscillator (ILO) circuitry 130, XOR circuitry 140, and XOR circuitry 150. The outputs of the S2D circuitry 110 are connected to the inputs of the QLL circuitry 120. The outputs of the QLL circuitry 120 are connected to the ILO circuitry 130. The outputs of the ILO circuitry 130 are connected to the XOR circuitry 140 and the XOR circuitry 150.

The S2D circuitry 110 receives the clock signal CLKI. The S2D circuitry generates the differential signals INJN and INJP from the single ended clock signal CLKI. The differential signals INJN and INJP are output to the QLL circuitry 120.

The QLL circuitry 120 receives the differential signals INJN and INJP from the S2D circuitry 110. The multi-phase clock signals CKR0, CKR90, CKR180, and CKR270 are generated from the differential signals INJN and INJP.

The QLL circuitry 120 includes ILO circuitry 122, quadrature phase error detector (QED) circuitry 124, and voltage to current (V2I) circuitry 126. The ILO circuitry 122 receives the differential signals INJN and INJP from the S2D circuitry and generates multi-phase clock signals CKD0, CKD45, CKD90, CKD135, CKD180, CKD225, CKD270, and CKD315. Each of the multi-phase clock signals CKD0, CKD45, CKD90, CKD135, CKD180, CKD225, CKD270, and CKD315 has a different phase. For example, the phase of the clock signal CKD45 differs from the phase of the clock signal CKD0 by 45 degrees. The phase of the clock signal CKD90 differs from the phase of the clock signal CKD45 by 45 degrees, and from the phase of the clock signal CKD0 by 90 degrees. The phase of the clock signal CKD135 differs from the phase of the clock signal CKD90 by 45 degrees, from the phase of the clock signal CKD45 by 90 degrees, and from the phase of the clock signal CKD0 by 135 degrees. The phase of the clock signal CKD180 differs from the phase of the clock signal CKD135 by 45 degrees, from the phase of the clock signal CKD90 by 90 degrees, from the phase of the clock signal CKD45 by 135 degrees and from the phase of the clock signal CKD0 by 180 degrees. The phase of the clock signal CKD225 differs from the phase of the clock signal CKD180 by 45 degrees, from the phase of the clock signal CKD135 by 90 degrees, from the phase of the clock signal CKD90 by 135 degrees, from the phase of the clock signal CKD45 by 180 degrees, and from the phase of the clock signal CKD0 by 225 degrees. The phase of the clock signal CKD270 differs from the phase of the clock signal CKD225 by 45 degrees, from the phase of the clock signal CKD180 by 90 degrees, from the phase of the clock signal CKD135 by 135 degrees, from the phase of the clock signal CKD90 by 180 degrees, from the phase of the clock signal CKD45 by 225 degrees and from the phase of the clock signal CKD0 by 270 degrees. The phase of the clock signal CKD315 differs from the phase of the clock signal CKD270 by 45 degrees, from the phase of the clock signal CKD225 by 90 degrees, from the phase of the clock signal CKD180 by 135 degrees, from the phase of the clock signal CKD135 by 180 degrees, from the phase of the clock signal CKD90 by 225 degrees, from the phase of the clock signal CK45 by 270 degrees, and from the phase of the clock signal CKD0 by 315 degrees.

The multi-phase clock signals CKD0, CKD45, CKD90, CKD135, CKD180, CKD225, CKD270, and CKD315 are received by the QED circuitry 124. The QED circuitry 124 compares two or more of the multi-phase clock signals CKD0, CKD45, CKD90, CKD135, CKD180, CKD225, CKD270, and CKD315 to determine an adjustment (or correction) value to apply to the ILO circuitry 122. The QED circuitry 124 detects the quadrature phase error between pairs of the multi-phase clock signals CKD0, CKD45, CKD90, CKD135, CKD180, CKD225, CKD270, and CKD315 that are in quadrature with each other. In one example, the phase difference is output as a control signal 125a or 125b (e.g., adjustment signals). The control signal 125a indicates an increase to the capacitance value of the varactors (e.g., the variable capacitors) of the ILO circuitry 122. The control signal 125b indicates a decrease to the capacitance value of the varactors of the ILO circuitry 122.

In one example, the QED circuitry 124 applies a logical XOR operation to the clock signals CKD45 and CKD135, and a logical XOR operation to the clock signals CKD0 and CKD90. The QED circuitry 124 applies the local XOR operation to the clock signals CKD45 and CKD135 to determine a phase error between the clock signals CKD45 and CKD135. Further, the QED circuitry 124 applies the local XOR operation to the clock signals CKD0 and CKD90 to determine a phase error between the clock signals CKD0 and CKD90. The phase errors are compared to each other to determine whether to increase the capacitance or decrease the capacitance of the varactors of the ILO circuitry 122 and one of the control signals 125a and 125b is generated. In other examples, other pairs of clock signals that are in quadrature with each other may be used to determine the control signals 125a and 125b.

In one example, the QED circuitry 124 generates the controls signals 125a and 125b based on an average quadrature error between pairs of the clock signals. The closer the natural frequency of the ILO circuitry 122 is to the frequency of the clock signal CLKI the smaller the magnitude of the control signals 125a and 125b is. The QED circuitry 124 tunes the frequency of the ILO circuitry 122 to the frequency of the clock signal CLKI. For example, the QED circuitry 124 converts the average quadrature error among two or more clock signal into control signals 125a, 125b. In one example, the QED circuitry 124 functions as a XOR for all of the phases. The control signals 125 are used to tune the bias voltage of a programmable capacitance of the ILO circuitry 122.

The V2I circuitry 126 receives the control signals 125a and 125b and generates the control signal 127. The V2I circuitry 126 converts the control signals 125a and 125b to a current signal that is output as the control signal 127. The control signal 127 is received by the ILO circuitry 122. One or more varactors of the ILO circuitry 122 are adjusted based on the control signal 127 to tune the natural frequency of the ILO circuitry 122 and reduces errors within the multi-phase clock signals generated by the ILO circuitry 122. The gain of the V2I circuitry 126 may be large to reduce quadrature errors within the multi-phase clock signal signals.

The phase correction loop including the QED circuitry 124 and the V2I circuitry 126 tunes the natural frequency of the ILO circuitry 122, reducing errors within the phases of the multi-phase clock signals CKD0, CKD45, CKD90, CKD135, CKD180, CKD225, CKD270, and CKD315. In one example, the QED circuitry 124 and the V2I circuitry 126 tune the natural frequency of the ILO circuitry 122 until the natural frequency is substantially close to (e.g., within about 10 percent) the frequency of the clock signal CLKI. In one example, the QED circuitry 124 and the V2I circuitry 126 tune the natural frequency of the ILO circuitry 122 until the natural frequency is substantially close to the frequency of the clock signal CLKI with residual error due to finite loop gain of the QED circuitry 124 and the V2I circuitry 126. In one example, the QED circuitry 124 and the V2I circuitry 126 tune the natural frequency of the ILO circuitry 122 until the natural frequency is about 8 GHz. In other examples, the QED circuitry 124 and the V2I circuitry 126 tune the natural frequency of the ILO circuitry 122 until the natural frequency is greater than or less than 8 GHz.

In one example, the frequency of the ILO circuitry 122 varies based on the frequency of the voltage supply signal 162 received from the voltage supply source 160. However, the QED circuitry 124 and the V2I circuitry 126 tune the natural frequency of the ILO circuitry 122 to mitigate variations with the frequency of the ILO circuitry 122.

The ILO circuitry 122 generates adjusted multi-phase clock signals CKD0, CKD45, CKD90, CKD135, CKD180, CKD225, CKD270, and CKD315 based on the control signal 127. For example, the phase of one or more of the adjusted multi-phase clock signals CKD0, CKD45, CKD90, CKD135, CKD180, CKD225, CKD270, and CKD315 differs from that of the multi-phase clock signals CKD0, CKD45, CKD90, CKD135, CKD180, CKD225, CKD270, and CKD315 generated before the control signal 127 is received. The adjusted multi-phase clock signals CKD0, CKD45, CKD90, CKD135, CKD180, CKD225, CKD270, and CKD315 are output from the QLL circuitry 120 by the ILO circuitry 122.

The ILO circuitry 130 is connected to the output of the ILO circuitry 122. Stated another way, the ILO circuitry 130 is cascaded with the ILO circuitry 122. The ILO circuitry 130 receives the adjusted multi-phase clock signals CKD0, CKD45, CKD90, CKD135, CKD180, CKD225, CKD270, and CKD315 from the ILO circuitry 122. The ILO circuitry 130 generates multi-phase clock signals CKE0, CKE45, CKE90, CKE135, CKE180, CKE225, CKE270, and CKE315.

Each of the multi-phase clock signals CKE0, CKE45, CKE90, CKE135, CKE180, CKE225, CKE270, and CKE315 has a different phase. For example, the phase of the clock signal CKE45 differs from the phase of the clock signal CKE0 by 45 degrees. The phase of the clock signal CKE90 differs from the phase of the clock signal CKE45 by 45 degrees, and from the phase of the clock signal CKE0 by 90 degrees. The phase of the clock signal CKE135 differs from the phase of the clock signal CKE90 by 45 degrees, from the phase of the clock signal CKE45 by 90 degrees, and from the phase of the clock signal CKE0 by 135 degrees. The phase of the clock signal CKE180 differs from the phase of the clock signal CKE135 by 45 degrees, from the phase of the clock signal CKE90 by 90 degrees, from the phase of the clock signal CKE45 by 135 degrees and from the phase of the clock signal CKE0 by 180 degrees. The phase of the clock signal CKE225 differs from the phase of the clock signal CKE180 by 45 degrees, from the phase of the clock signal CKE135 by 90 degrees, from the phase of the clock signal CKE90 by 135 degrees, from the phase of the clock signal CKE45 by 180 degrees, and from the phase of the clock signal CKE0 by 225 degrees. The phase of the clock signal CKE270 differs from the phase of the clock signal CKE225 by 45 degrees, from the phase of the clock signal CKE180 by 90 degrees, from the phase of the clock signal CKE135 by 135 degrees, from the phase of the clock signal CKE90 by 180 degrees, from the phase of the clock signal CKE45 by 225 degrees, and from the phase of the clock signal CKE0 by 270 degrees. The phase of the clock signal CKE315 differs from the phase of the clock signal CKE270 by 45 degrees, from the phase of the clock signal CKE225 by 90 degrees, from the phase of the clock signal CKE180 by 135 degrees, from the phase of the clock signal CKE135 by 180 degrees, from the phase of the clock signal CKE90 by 225 degrees, from the phase of the clock signal CK45 by 270 degrees, and from the phase of the clock signal CKE0 by 315 degrees.

In one example, the ILO circuitry 130 receives voltage supply signal 162 from the voltage supply source 160 and the control signal 127 from the V2I circuitry 126. In such an example, the ILO circuitry 130 and the ILO circuitry 122 receive the same voltage supply signal 162 and control signal 127 and are tuned to the same frequency. Tuning the ILO circuitry 130 and the ILO circuitry 122 to the same frequency reduces phase errors within the multi-phase clock signals CKE0, CKE45, CKE90, CKE135, CKE180, CKE225, CKE270, and CKE315. In another example, ILO circuitry 130 receives a different voltage supply signal than that of the ILO circuitry 122 and/or is tuned to a difference frequency that the ILO circuitry 122. In one or more examples, the sizing and geometry of the ILO circuitry 130 and the ILO circuitry 122 is the same. In another example, one or more of the sizing and geometry of the ILO circuitry and the ILO circuitry 122 differ.

The ILO circuitry 130 differs from the ILO circuitry 122 in that the ILO circuitry 130 receives eight input signals (e.g., has eight input injections), while the ILO circuitry 122 receives two input signals (e.g., two input injections). For example, the input signals received by the ILO circuitry 130 are the clock signals CKD0, CKD45, CKD90, CKD135, CKD180, CKD225, CKD270, and CKD315, and the input to the ILO circuitry 122 is the differential signals INJN and INJP.

As the ILO circuitry 130 receives eight multi-phase clock signals to generate the eight multi-phase clock signals, the multi-phase clock signals generated by the ILO circuitry 130 have reduced phase errors (e.g., have an increased accuracy) as compared to the multi-phase clock signals generated by the ILO circuitry 122. In one example, the ILO circuitry 130 generates multi-phase clock signals CKE0, CKE45, CKE90, CKE135, CKE180, CKE225, CKE270, and CKE315 that have a reduced phase error and jitter as compared to the multi-phase clock signals CKD0, CKD45, CKD90, CKD135, CKD180, CKD225, CKD270, and CKD315.

The ILO circuitry 130 functions as a low pass filter (LPF). In such an example, the ILO circuitry 130 suppresses duty cycle distortion (DCD) and/or phase error within the multi-phase clock signals CKD0, CKD45, CKD90, CKD135, CKD180, CKD225, CKD270, and CKD315.

Inputs of the XOR circuitry 140 and the XOR circuitry 150 are coupled to outputs of the ILO circuitry 130. In one example, the XOR circuitry 140 and the XOR circuitry 150 are identical. For example, the XOR circuitry 140 and the XOR circuitry 150 have the same configuration and types of transistors. The XOR circuitry 140 and the XOR circuitry 150 generate clock signals having an increased frequency as compared to that of the frequency of the reference clock signal CLKI. In one example, the XOR circuitry 140 and the XOR circuitry 150 generate clock signals having a frequency of at least about 20 GHz, at least about 22 GHz, at least about 28 GHZ, or more.

In the example of FIG. 1, the XOR circuitry 140 receives clock signals CKE0, CKE180, CKE90, and CKE270, and the XOR circuitry 150 receives clock signals CKE45, CKE225, CKE135, and CKE315. The XOR circuitry 140 generates clock signals CKR0 and CKR180 from the clock signals CKE0, CKE180, CKE90, and CKE270 and the XOR circuitry 150 generates CKR90 and CKR270 from the clock signals CKE45, CKE225, CKE135, and CKE315. The frequency of the clock signals CKR0, CKR90, CKR180, and CKR270 is greater than that of the input clock signal CLKI. For example, the frequency of the clock signals CKR0, CKR90, CKR180, and CKR270 is N times than that of the input clock signal CLKI. N is greater than 1. In one specific example, N is 2.

In one example, each of the S2D circuitry 110, the ILO circuitry 122, the QED circuitry 124, the V2I circuitry 126, the ILO circuitry 130, the XOR circuitry 140, and the XOR circuitry 150 receives the voltage supply signal 162 from the voltage supply source 160. In other examples, one or more of the S2D circuitry 110, the ILO circuitry 122, the QED circuitry 124, the V2I circuitry 126, the ILO circuitry 130, the XOR circuitry 140, and the XOR circuitry 150 receive a voltage supply source that differs from the voltage supply signal received by another one or more of the S2D circuitry 110, the ILO circuitry 122, the QED circuitry 124, the V2I circuitry 126, the ILO circuitry 130, the XOR circuitry 140, and the XOR circuitry 150. The voltage level of the voltage supply signal 162 is about 0.88 V. In other examples, the voltage level of the voltage supply signal is greater than or less than about 0.88 V.

Figure 2:
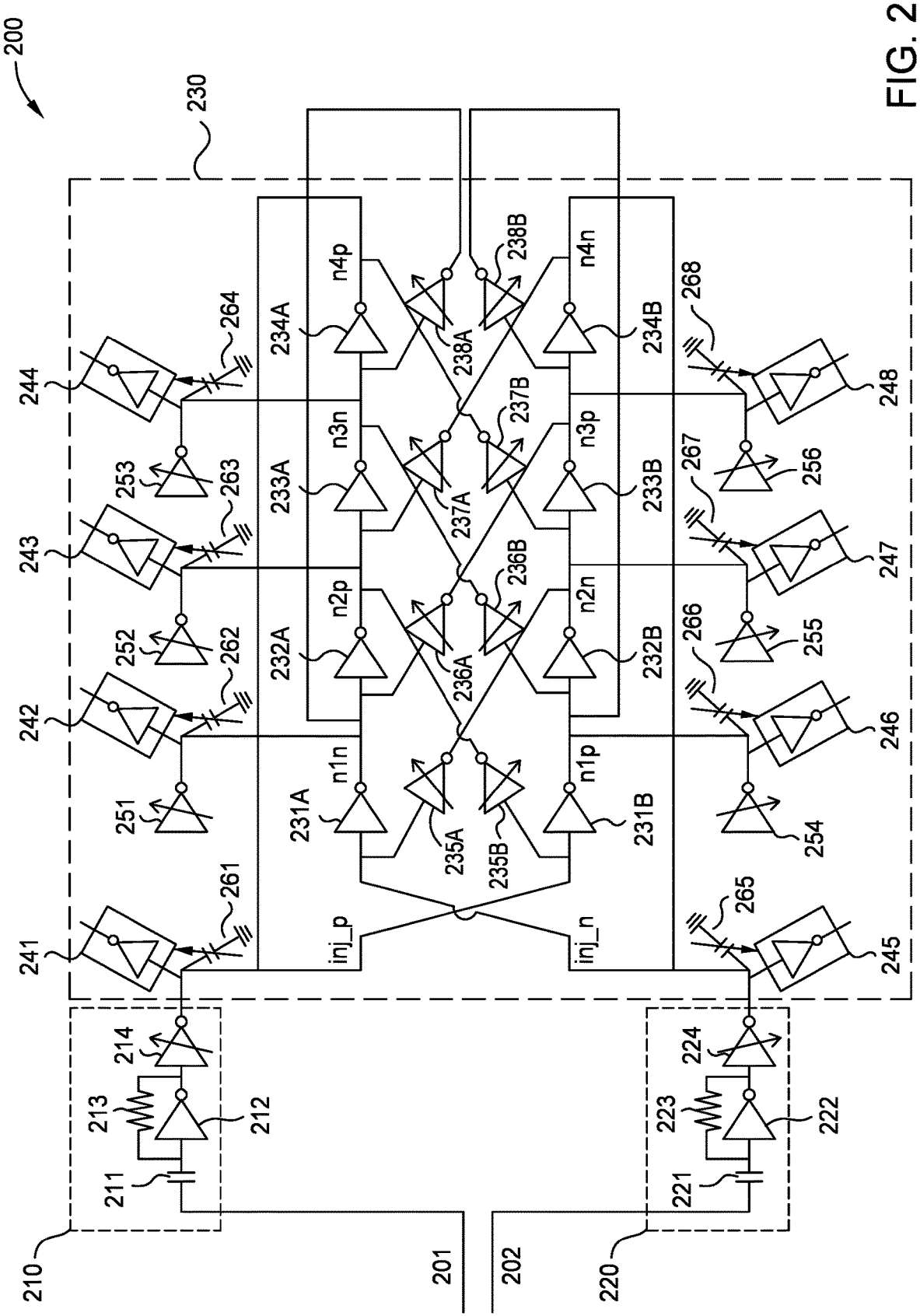
FIG. 2 is a schematic diagram of injection locked oscillator circuitry, according to an example.

FIG. 2 illustrates ILO circuitry 200, according to one or more examples. With reference to FIG. 1, the ILO circuitry 122 and/or the ILO circuitry 130 may be configured similar to that of the ILO circuitry 200. The ILO circuitry 200 receives the differential signals 201 and 202. The differential signals 201 and 202 may be the differential signals INJN and INJP of FIG. 1. The differential signals 201 and 202 may be complementary differential signals. The differential signal 201 is received by a clock injection stage 210 and the differential signal 202 is received by the clock injection stage 220. The clock injection stage 210 includes a capacitor 211 in series with a self-biased inverter 212 and a bias resistor 213. Further, the clock injection stage 210 includes a programmable inverter 214 connected in series with the self-biased inverter 212 and the bias resistor 213. The clock injection stage 220 includes a capacitor 221 in series with a self-biased inverter 222 and a bias resistor 223. Further, the clock injection stage 220 includes a programmable inverter 224 connected in series with the self-biased inverter 222 and the bias resistor 223. The programmable inverters 214 and 224 increase the injection strength of the ILO circuitry 200.

The output of the clock injection stage 210 and the output of the clock injection stage 220 are output to the phase locked loop (PLL) stage 230. The PLL stage 230 includes a multiple stage ring oscillator. The PLL stage 230 includes a four-stage ring oscillator. A first stage includes inverters 231A and 231B, and programmable inverters 235A and 235B. A second stage includes inverters 232A and 232B, and programmable inverters 236A and 236B. A third stage includes inverters 233A and 233B, and programmable inverters 237A and 237B. A fourth stage includes inverters 234A and 233B, and programmable inverters 238A and 238B. The PLL stage 230 further includes buffers 251-256. Each buffer 251-256 is coupled to an output of one of the stages of the ring oscillator. For example, each of the buffers 251 and 254 is coupled to an output of the first stage, each of the buffers 252 and 255 is coupled to an output of the second stage, and each of the buffers 253 and 257 is coupled to an output of the third stage. The buffers 251-256 balance the loading of the corresponding stages of the oscillator tank, adjusting the phase of a corresponding output signal.

The PLL stage 230 further includes inverters 241-248 and variable capacitors 261-268 coupled to the outputs the ILO circuitry 200. For example, the inverter 241 and the variable capacitor 261 are coupled to a first output of the ILO circuitry 200, and the inverter 245 and the variable capacitor 265 are coupled to a second output of the ILO circuitry 200. The first output and second output correspond to an injection stage of the PLL stage 230. The inverter 242 and the variable capacitor 262 are coupled to a third output of the ILO circuitry 200, and the inverter 246 and the variable capacitor 266 are coupled to a fourth output of the ILO circuitry 200. The third output and fourth output correspond to a first stage of the PLL stage 230. The inverter 243 and the variable capacitor 263 are coupled to a fifth output of the ILO circuitry 200, and the inverter 247 and the variable capacitor 267 are coupled to a sixth output of the ILO circuitry 200. The fifth output and sixth output correspond to a second stage of the PLL stage 230. The inverter 244 and the variable capacitor 264 are coupled to a seventh output of the ILO circuitry 200, and the inverter 248 and the variable capacitor 268 are coupled to an eighth output of the ILO circuitry 200. The seventh output and the eighth output correspond to a third stage of the PLL stage 230.

In one example, the ILO circuitry 200 outputs a respective clock signal from each of the inverters 241-248. The clock signals are evenly spaced at multiples of 45 degrees. The clock signals include a first clock signal having a phase of 0 degrees, a second clock signal having a phase of 45 degrees, a third clock signal having a phase of 90 degrees, a fourth clock signal having a phase of 135 degrees, a fifth clock signal having a phase of 180 degrees, a sixth clock signal having a phase of 225 degrees, a seventh clock signal having a phase of 280 degrees, and an eighth clock signal having a phase of 315 degrees.

In one or more examples, adjusting one or more of the buffers 251-256, the inverters 241-248, and the variable capacitors 261-268 adjusts the phase of one or more of the clock signals output by the ILO circuitry 200. In one example, adjusting the inverters 231A-234A, 231 B-234B, 235A-238A, and 235B-238B adjusts the oscillation frequency of the PLL stage 230.

In one example, the ILO circuitry 200 may be referred to as a phase forwarding ILO. Phase forwarding is associated with the inverters that drive the phases that are ahead in the ring structure (i.e., inverter pairs 235, 236, 237, 238). By varying the strengths of the inverter pairs 235, 236, 237, 238, the oscillation speed can be changed. In one example, based on one or more inverter pairs 235, 236, 237, 238 being turned off, the oscillation frequency is determined by each inverter stage's delay. When phase forwarding is enable, oscillation frequency is increased as the effective delay of each inverter stage is reduced. In one example, a phase forwarding ILO circuitry refers to an injection oscillator with phase interpolation in each node. For example, in FIG. 2, the node n1n is the interpolation of inverter 231A and 238A (phase forwarded). In one example, phase forwarding increases the oscillation frequency of the ILO circuitry 200.

Figure 3:
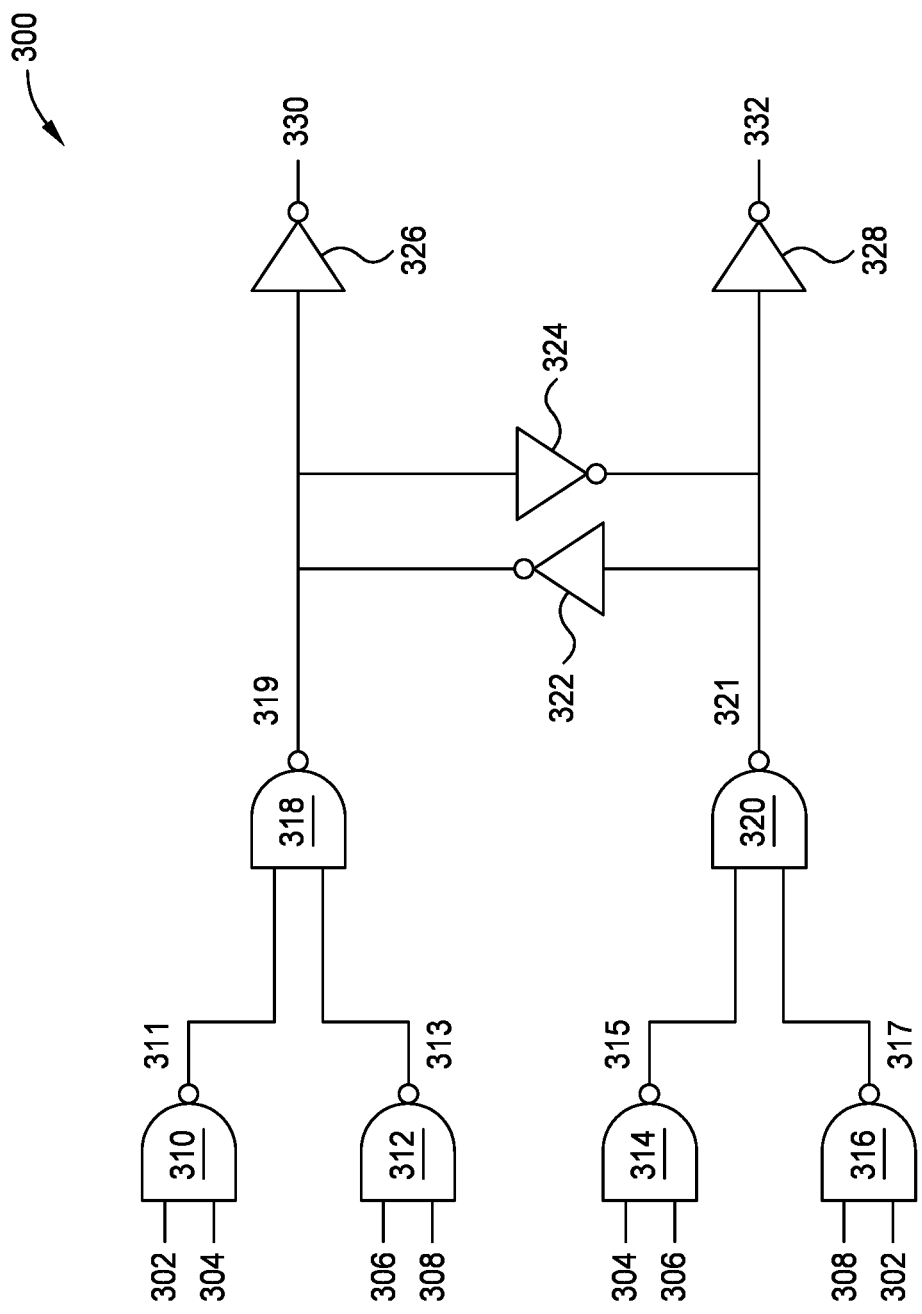
FIG. 3 is a schematic diagram of an XOR gate, according to an example.

FIG. 3 illustrates XOR gate 300, according to one or more examples. The XOR circuitry 140 and/or the XOR circuitry 150 of FIG. 1 may be configured similar to the XOR gate 300. The XOR gate 300 includes NAND gates 310-320 and inverters 322, 324, 326, and 328. In one example, the NAND gate 310 receives signals 302 and 304, the NAND gate receives signals 306 and 308, the NAND gate receives signals 304 and 306, and the NAND gate receives signals 308 and 302. Accordingly, the NAND gates 310-316 receive four signals, e.g., signals 302-308. In one example, the signal 302 corresponds to the clock signal CKE0 of FIG. 1, the signal 304 corresponds to the clock signal CKE90 of FIG. 1, the signal 306 corresponds to the clock signal CKE180 of FIG. 1, and the signal 308 corresponds to the clock signal CKE270 of FIG. 1. In another example, the signal 302 corresponds to the clock signal CKE45 of FIG. 1, the signal 304 corresponds to the clock signal CKE135 of FIG. 1, the signal 306 corresponds to the clock signal CKE225 of FIG. 1, and the signal 308 corresponds to the clock signal CKE315 of FIG. 1.

The NAND gate 310 outputs the signal 311 based on the signals 302 and 304. The signal 311 has a high voltage level (e.g., a logic level of 1) based on the signal 302 or the signal 304 having a low voltage level (e.g., a logic level of 0). The signal 311 has a low voltage level based on the signal 302 and the signal 304 having a high voltage level.

The NAND gate 312 outputs the signal 313 based on the signals 306 and 308. The signal 313 has a high voltage level based on the signal 306 or the signal 308 having a low voltage level. The signal 313 has a low voltage level based on the signal 306 and the signal 308 having a high voltage level.

The NAND gate 314 outputs the signal 315 based on the signals 304 and 306. The signal 315 has a high voltage level based on the signal 304 or the signal 306 having a low voltage level. The signal 315 has a low voltage level based on the signal 304 and the signal 306 having a high voltage level.

The NAND gate 316 outputs the signal 317 based on the signals 302 and 308. The signal 317 has a high voltage level based on the signal 302 or the signal 308 having a low voltage level. The signal 317 has a low voltage level based on the signal 302 and the signal 308 having a high voltage level.

The NAND gate 318 receives the signals 311 and 313 and outputs the signal 319 based on the signals 311 and 313. The signal 319 has a high voltage level based on the signal 311 or the signal 313 having a low voltage level. The signal 319 has a low voltage level based on the signal 311 and the signal 313 having a high voltage level.

The NAND gate 320 receives the signals 315 and 317 and outputs the signal 321 based on the signals 315 and 317. The signal 321 has a high voltage level based on the signal 315 or the signal 317 having a low voltage level. The signal 321 has a low voltage level based on the signal 315 and the signal 317 having a high voltage level.

The inverter 326 receives the signal 319 and generates the signal 330. The inverter 326 inverts the signal 319 to generate the signal 330. The inverter 328 receives the signal 321 and generates the signal 332. The inverter 328 inverts the signal 321 to generate the signal 332.

In one example, the frequency of the signals 330 and 332 is N times the frequency of the signals 302-308. N is 2. In other examples, N is greater than 2. With reference to FIG. 1, the signals 330 and 332 correspond to clock signals CKR0 and CKR180 or clock signals CRK90 and CRK270.

Figure 4:
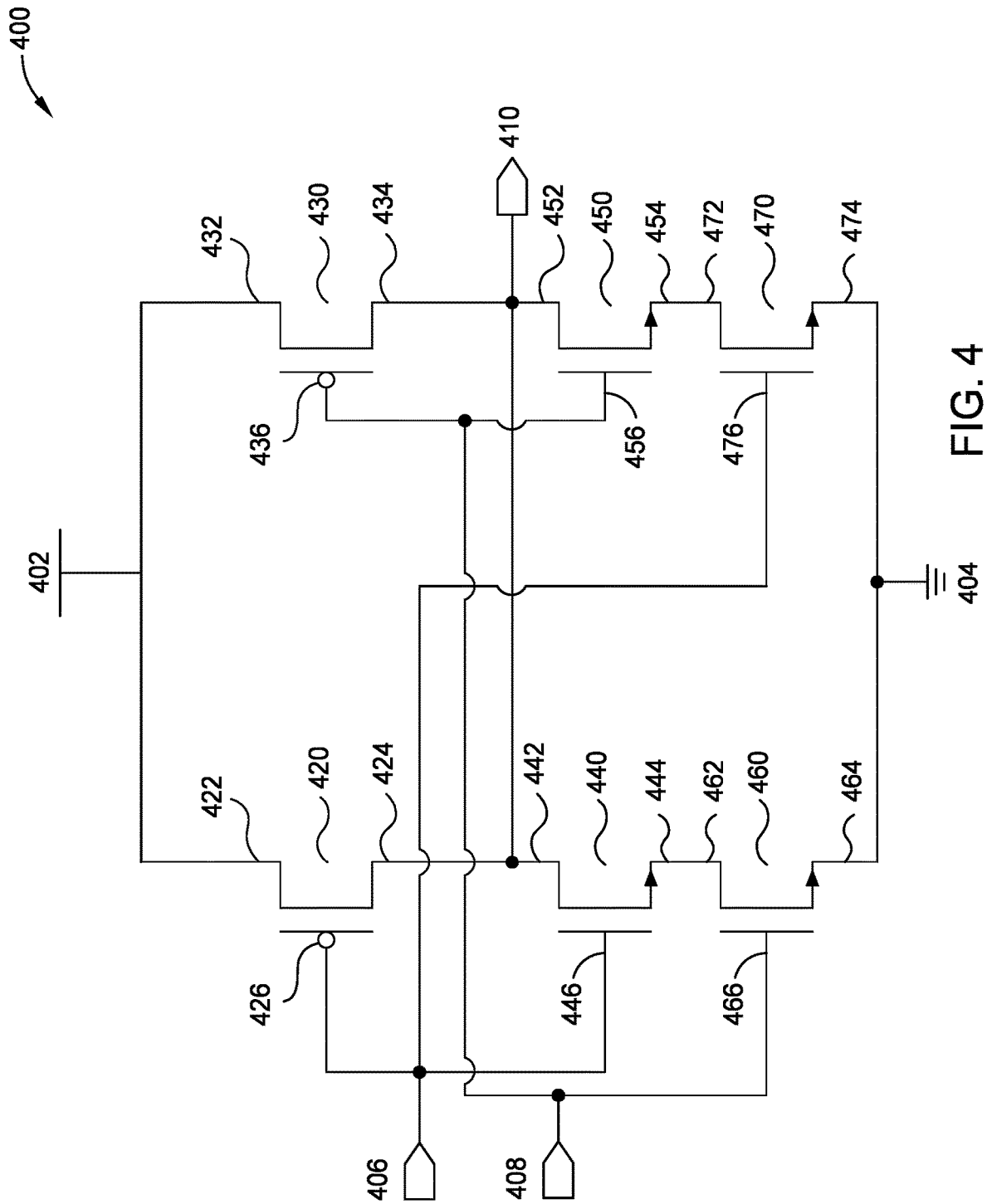
FIG. 4 is a schematic diagram of an NAND gate, according to an example.
Figure 5:
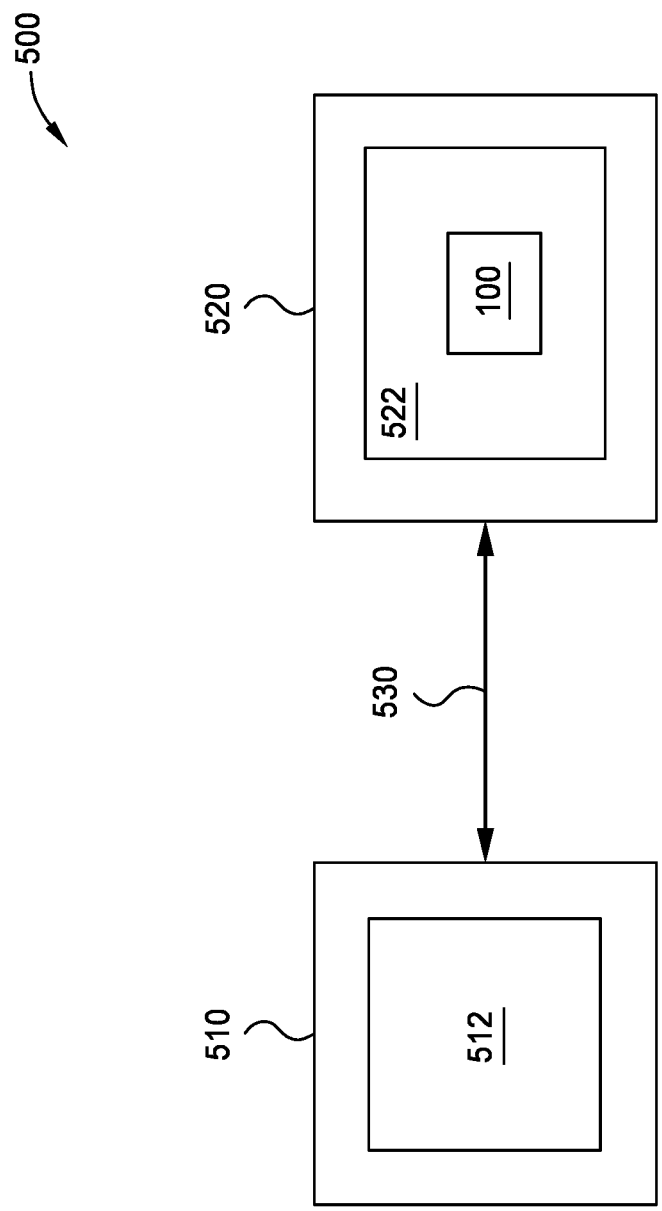
FIG. 5 is a schematic block diagram of a communication system, according to an example.

FIG. 4 illustrates NAND gate 400, according to one or more examples. The NAND gates 310, 312, 316, 318, and 320 of FIG. 3 may be configured similar to that of the NAND gate 400. In one example, the NAND gate 400 is an input balanced NAND gate. The NAND gate 400 is coupled to the voltage supply 402 and the reference voltage supply (e.g., ground supply) 404. The voltage supply 402 provides a voltage supply signal having a voltage level greater than that of the reference supply signal provided by the reference voltage supply. In one example, the reference supply signal provides a ground voltage signal. In another example, the voltage supply 402 is the voltage supply source 160 of FIG. 1, and the corresponding voltage supply signal is 162. The voltage supply 402 is a DC voltage supply that outputs a DC voltage signal.

The NAND gate 400 includes input nodes 406 and 408 and output node 410. The NAND gate 400 receives a first input signal via the input node 406 and a second input signal via the input node 408. In one example, with reference to FIG. 1, the first input signal is a first one of the clock signals CKE0, CKE45, CKE90, CKE135, CKE180, CKE225, CKE270, and CKE315, and a second input signal is a second one of the clock signals CKE0, CKE45, CKE90, CKE135, CKE180, CKE225, CKE270, and CKE315. With reference to FIG. 3, the first and second input signals are two of the signals 302, 304, 306, 308, 311, 313, 315, and 317. The output node 410 outputs a signal based on the signals received at the input nodes 406 and 408. In one example, the signal output by the output node 410 is one of the signals 311, 313, 315, 317, 319, and 321 of FIG. 3.

The NAND gate 400 includes transistors 420, 430, 440, 450, 460, and 470. In one example, the transistors 420 and 430 are PMOS transistors and the transistors 440, 450, 460, and 470 are NMOS transistors. In other examples, other configurations and/or types of transistors may be used.

The transistor 420 includes a drain 422 coupled to the voltage supply 402, a source 424 coupled to the output node 410, and a gate 426 coupled to the input node 406. The transistor 430 includes a drain 432 coupled to the voltage supply 402, a source 434 coupled to the output node 410, and a gate 436 coupled to the input node 408.

The transistor 440 includes a drain 442 coupled to the output node 410, a source 444, and a gate 446 coupled to the input node 406. The transistor 450 includes a drain 452 coupled to the output node 410, a source 454, and a gate 456 coupled to the input node 408. The transistor 460 includes a drain 462 coupled to the source 444 of the transistor 440, a source 464 coupled to the reference voltage supply 404, and a gate 466 coupled to the input node 408. The transistor 470 includes a drain 472 coupled to the source 454 of the transistor 440, a source 474 coupled to the reference voltage supply 404, and a gate 476 coupled to the input node 406.

In one or more examples, the clock generation circuitry 100 is part of a communication system. For example, the clock generation circuitry 100 is included within the communication system 500. The communication system 500 includes transceiver circuitry 510 and transceiver circuitry 520. The transceiver circuitry 510 may be serializer-deserializer (SerDes) circuitry. The transceiver circuitry 510 includes transmitter circuitry 512. While not illustrated, the transceiver circuitry 510 further includes receiver circuitry and control circuitry. The transceiver circuitry 520 includes receiver circuitry 522. The receiver circuitry 522 includes clock generation circuitry 100. The clock generation circuitry 100 may be part of a phase interpolator (PI) circuitry of the receiver circuitry 522. While not illustrated, the transceiver circuitry 520 additionally includes transmitter circuitry and control circuitry. In one example, the clock generation circuitry 100 generates clock signals CKR0, CKR90, CKR180 and CKR270 which are used by the receiver circuitry 522 in receiving and processing a data signal received over the communication channel 530 from the transmitter circuitry 512. In one example, the transceiver circuitry 510 further includes clock generation circuitry configured similar to that of the clock generation circuitry 100.

The transceiver circuitry 510 is communicatively coupled to the transceiver circuitry 520 via the communication channel 530. In one example, the transmitter circuitry 512 is communicatively coupled to the receiver circuitry 522 via the communication channel 530. The transmitter circuitry 512 communicates data to the receiver circuitry 522 via the communication channel 530. The communication channel 530 is a high speed communication channel. For example, the communication channel 530 supports a communication speed of at least about 100 Gbps, 200 Gbps, or more. Further, the transmitter circuitry 512 outputs a reference clock to the receiver circuitry 522. For example, the transmitter circuitry 512 outputs the reference clock signal CLKI to the receiver circuitry 522.

Figure 6:
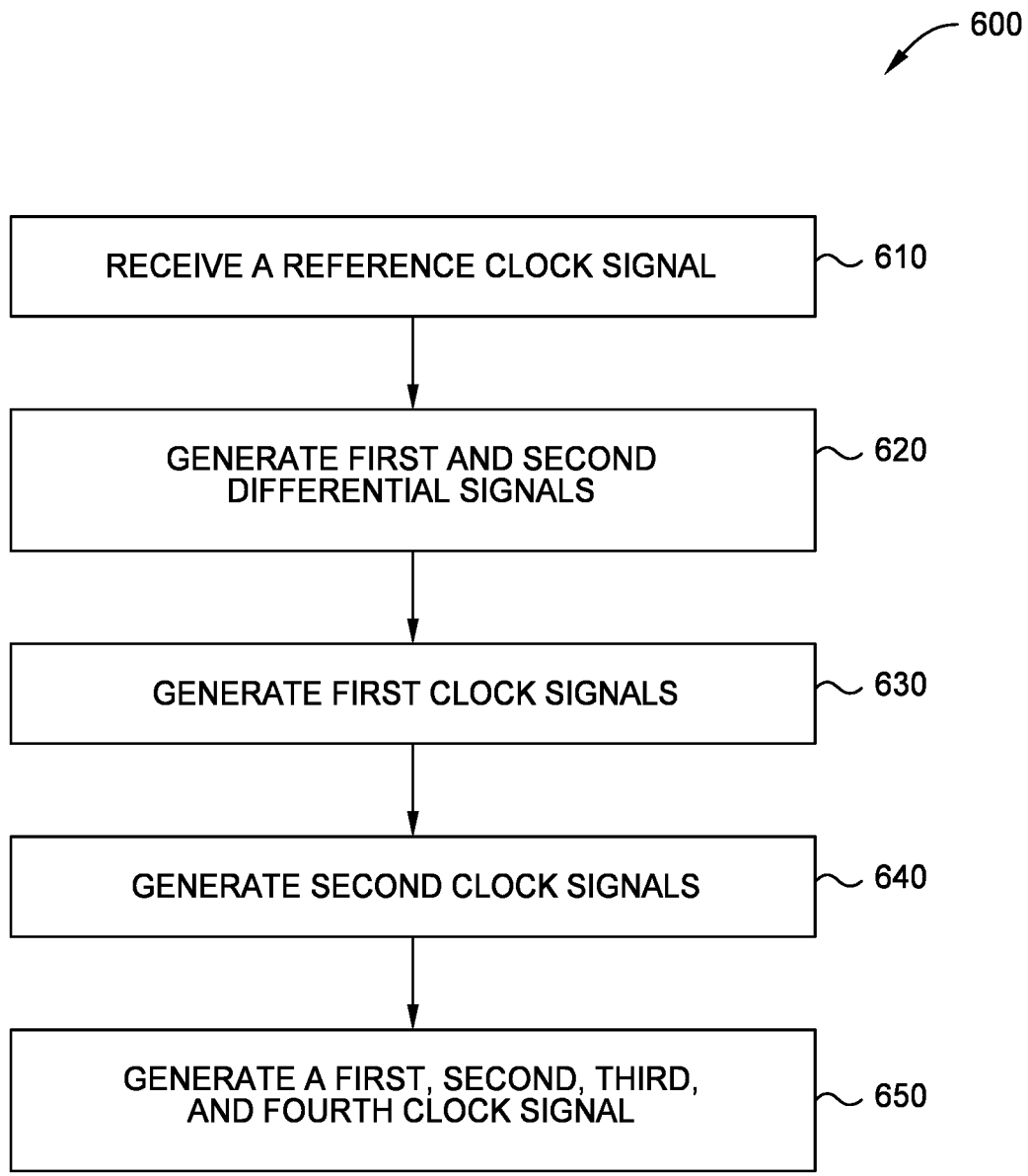
FIG. 6 is a flow chart of a method for generating multi-phase clock signals, according to an example.

FIG. 6 illustrates a flowchart of a method 600 for generating multi-phase clock signals, according to one or more examples. At block 610, a reference clock signal is received. For example, with reference to FIG. 1, the S2D circuitry 110 receives the clock signal CLKI. At block 620, first and second differential signals are generated. For example with reference to FIG. 1, the S2D circuitry 110 generates the differential input signals INJN and INJP from the clock signal CLKI. At block 630, first clock signals are generated. The first clock signals are generated from the first and second differential signal generated at block 620. In one example with reference to FIG. 1, the QLL circuitry 120 receives the differential input signals INJN and INJP and generates the multi-phase clock signals CKD0-CKD315. In one specific example, the ILO circuitry 122 generates the multi-phase clock signals CKD0-CKD315 from the differential input signals INJN and INJP. At block 640, second clock signals are generated from the first clock signals. In one example with reference to FIG. 1, the ILO circuitry 130 receives the multi-phase clock signals CKD0-CKD315 and generates the multi-phase clock signals CKE0-CKE315.

At block 660, a first, second, third, and fourth clock signal are generated from the second clock signals. For example with reference to claim 1, the XOR circuitry 140 and the XOR circuitry 160 generates the clock signals CKR0, CKR180, CKR90, and CKR270, respectively, from the multi-phase clock signals CKE0-CKE315. In one example, the XOR circuitry 140 receives the clock signals CKE0, CKE90, CKE180, and CKE270 and generates the clock signals CKR0 and CKR180. Further, the XOR circuitry 160 receives the clock signals CKE45, CKE135, CKE225, and CKE315 and generates the clock signals CKR90 and CKR270.

Clock generation circuitry for a high speed (e.g., at least about 200 Gbps) communication system is described in the above. The clock generation circuitry generates a multiphase clock signal from a single phase reference clock signal. Further, the clock generation circuitry increases the frequency of the multi-phase clock signal with reference to the reference clock signal. In one example, the clock generation circuitry includes QLL circuitry having ILO circuitry which is cascaded with ILO circuitry and XOR circuitry.

While the foregoing is directed to specific examples, other and further examples may be devised without departing from the basic scope thereof, and the scope thereof is determined by the claims that follow.

What is claimed is:

1. A clock generation circuitry comprising:
   quadrature locked loop circuitry comprising first injection locked oscillator circuitry configured to:
      receive a first input signal and a second input signal and output first clock signals, wherein the first input signal and the second input signal correspond to a reference clock signal; and
      generate adjusted first clock signals based on a first control signal, wherein the first control signal is generated based on the first clock signals;
   injection locked oscillator circuitry coupled to outputs of the first injection locked oscillator circuitry, and configured to receive the first control signal, receive the first clock signals, and generate second clock signals based on the first control signal; and
   output circuitry configured to receive the second clock signals and generate a first clock signal, a second clock signal, a third clock signal, and a fourth clock signal, wherein frequencies of the first clock signal, the second clock signal, the third clock signal, and the fourth clock signal are greater than a frequency of the reference clock signal.

2. The clock generation circuitry of claim 1, wherein the first injection locked oscillator circuitry and the second injection locked oscillator circuitry are configured to receive a first supply signal.

3. The clock generation circuitry of claim 1, wherein the quadrature locked loop circuitry further comprises:
   quadrature phase error detector circuitry configured to receive the first clock signals and output a first adjustment signal based on the first clock signals; and
   voltage to current circuitry configured to receive the first adjustment signal and generate the first control signal based on the first adjustment signal, and wherein the first injection locked oscillator circuitry is further configured to receive the first control signal.

4. The clock generation circuitry of claim 3, wherein the quadrature phase error detector circuitry is configured to generate the first adjustment signal based on a first phase error of a first pair of the first clock signals and a second phase error of a second pair of the first clock signals.

5. The clock generation circuitry of claim 1, wherein the output circuitry comprises XOR circuitry, the XOR circuitry comprises:
   a first NAND gate configured to receive a first one of the second clock signals and a second one of the second clock signals;
   a second NAND gate configured to receive a third one of the second clock signals and a fourth one of the second clock signals;
   a third NAND gate configured to receive the second one of the second clock signals and the third one of the second clock signals; and
   a fourth NAND gate configured to receive the first one of the second clock signals and the fourth one of the second clock signals.

6. The clock generation circuitry of claim 5, wherein the first NAND gate comprises:
   a first transistor coupled between a first node, and an output node and comprising a gate configured to receive the second one of the second clock signals;
   a second transistor coupled between the first node, and the output node and comprising a gate configured to receive the first one of the second clock signals;
   a third transistor coupled to the output node, and comprising a gate configured to receive the second one of the second clock signals;
   a fourth transistor coupled to the third transistor and a second node, and comprising a gate configured to receive the first one of the second clock signals;
   a fifth transistor coupled to the output node, and comprising a gate configured to receive the first one of the second clock signals; and
   a sixth transistor coupled to the fifth transistor and the second node, and comprising a gate configured to receive the second one of the second clock signals.

7. A communication system comprising:
   transceiver circuitry configured to receive a reference clock signal, the transceiver circuitry comprising:
      quadrature locked loop circuitry configured to generate differential input signals from the reference clock signal, the quadrature locked loop circuitry comprising a first injection locked oscillator circuitry configured to:
         receive the differential input signals and output first clock signals; and
         generate adjusted first clock signals based on a first control signal, wherein the first control signal is generated based on the first clock signals;
      second injection locked oscillator circuitry coupled to outputs of the first injection locked oscillator circuitry and configured to receive the first control signal, receive the first clock signals, and generate second clock signals based on the first control signal; and
      output circuitry configured to receive the second clock signals and generate a first clock signal, a second clock signal, a third clock signal, and a fourth clock signal, wherein frequencies of the first clock signal, the second clock signal, the third clock signal, and the fourth clock signal are greater than a frequency of the reference clock signal.

8. The communication system of claim 7, wherein the first injection locked oscillator circuitry and the second injection locked oscillator circuitry are configured to receive a first supply signal.

9. The communication system of claim 7, wherein the quadrature locked loop circuitry further comprises:
   quadrature phase error detector circuitry configured to receive the first clock signals and output a first adjustment signal based on the first clock signals; and
   voltage to current circuitry configured to receive the first adjustment signal and generate the first control signal based on the first adjustment signal, and wherein the first injection locked oscillator circuitry is further configured to receive the first control signal.

10. The communication system of claim 9, wherein the quadrature phase error detector circuitry is configured to generate the first adjustment signal based on a first phase error of a first pair of the first clock signals and a second phase error of a second pair of the first clock signals.

11. The communication system of claim 7, wherein the output circuitry is XOR circuitry, the XOR circuitry comprises:
   a first NAND gate configured to receive a first one of the second clock signals and a second one of the second clock signals;
   a second NAND gate configured to receive a third one of the second clock signals and a fourth one of the second clock signals;
   a third NAND gate configured to receive the second one of the second clock signals and the third one of the second clock signals; and
   a fourth NAND gate configured to receive the first one of the second clock signals and the fourth one of the second clock signals.

12. The communication system of claim 11, wherein the first NAND gate comprises:
   a first transistor coupled between a first node, and an output node and comprising a gate configured to receive the second one of the second clock signals;
   a second transistor coupled between the first node, and the output node and comprising a gate configured to receive the first one of the second clock signals;
   a third transistor coupled to the output node, and comprising a gate configured to receive the second one of the second clock signals;
   a fourth transistor coupled to the third transistor and a second node, and comprising a gate configured to receive the first one of the second clock signals;
   a fifth transistor coupled to the output node, and comprising a gate configured to receive the first one of the second clock signals; and
   a sixth transistor coupled to the fifth transistor and the second node, and comprising a gate configured to receive the second one of the second clock signals.

13. A method comprising:
   receiving a reference clock signal;
   generating first and second differential signals from the reference clock signal;
   generating, via first injection locked oscillator circuitry of quadrature locked loop circuitry, first clock signals from the first and second differential signals;
   generating first adjusted clock signals based on a first control signal, wherein the first control signal is generated based on the first clock signals;
   receiving, via second injection locked oscillator circuitry, the first control signal;
   generating, via the second injection locked oscillator circuitry, second clock signals from the first clock signals based on the first control signal; and
   generating, via output circuitry, a first clock signal, a second clock signal, a third clock signal, and a fourth clock signal from the second clock signals, wherein frequencies of the first clock signal, the second clock signal, the third clock signal, and the fourth clock signal are greater than a frequency of the reference clock signal.

14. The method of claim 13 further comprising receiving, at the first injection locked oscillator circuitry and the second injection locked oscillator circuitry, a first supply signal.

15. The method of claim 13 further comprising:
   generating, via quadrature phase error detector circuitry, a first adjustment signal based on the first clock signals, wherein the first control signal is generated based on the first adjustment signal; and
   generating, via the first injection locked oscillator circuitry, the adjusted first clock signals based on the first control signal.

16. The method of claim 15, wherein the first adjustment signal is generated based on a first phase error of a first pair of the first clock signals and a second phase error of a second pair of the first clock signals.

17. The method of claim 13, wherein the output circuitry is XOR circuitry, the XOR circuitry comprises a first NAND gate configured to receive a first one of the second clock signals and a second one of the second clock signals, and wherein the first NAND gate comprises:
   a first transistor coupled between a first node, and an output node and comprising a gate configured to receive the second one of the second clock signals;
   a second transistor coupled between the first node, and the output node and comprising a gate configured to receive the first one of the second clock signals;
   a third transistor coupled to the output node, and comprising a gate configured to receive the second one of the second clock signals;
   a fourth transistor coupled to the third transistor and a second node, and comprising a gate configured to receive the first one of the second clock signals;
   a fifth transistor coupled to the output node, and comprising a gate configured to receive the first one of the second clock signals; and
   a sixth transistor coupled to the fifth transistor and the second node, and comprising a gate configured to receive the second one of the second clock signals.

* * * * *